United States Patent [19]

Wills

[11] Patent Number: 4,598,453
[45] Date of Patent: Jul. 8, 1986

[54] APPARATUS FOR CENTERING AND ALIGNING A WORKPIECE

[75] Inventor: Thomas M. Wills, Hershey, Pa.

[73] Assignee: E. I. Du Pont de Nemours and Company, Wilmington, Del.

[21] Appl. No.: 685,010

[22] Filed: Dec. 21, 1984

[51] Int. Cl.[4] .................................... B25B 27/14
[52] U.S. Cl. ...................... 29/271; 269/47; 269/231
[58] Field of Search ............... 29/271; 279/1 L; 269/900, 47, 231, 235, 309, 310

[56] References Cited

U.S. PATENT DOCUMENTS

| | | | |
|---|---|---|---|
| 724,116 | 3/1903 | Maley | 269/900 |
| 1,795,525 | 3/1931 | Trautner . | |
| 2,430,613 | 11/1947 | Hodge | 269/231 |
| 3,457,828 | 7/1969 | Durham . | |
| 3,473,420 | 10/1969 | Boggs . | |
| 3,565,416 | 2/1971 | Williamson et al. . | |
| 3,598,392 | 8/1971 | Williamson et al. | 269/47 |
| 3,827,685 | 8/1974 | Wennes | 269/231 |
| 3,918,694 | 11/1975 | Laudick | 269/47 |
| 4,191,366 | 3/1980 | Rabin . | |
| 4,395,585 | 7/1983 | Polcyn . | |
| 4,399,988 | 8/1983 | De Shong . | |
| 4,477,064 | 10/1984 | DiGiulio | 269/231 |

Primary Examiner—Robert C. Watson

[57] ABSTRACT

A planar workpiece such as a printed circuit board or a ceramic substrate for an integrated circuit is aligned by apparatus including three pivotal cams that initially fit relatively loosely in three apertures in the workpiece. As the cams are rotated, they contact the sides of the apertures and thereby urge the workpiece into a centered and aligned position.

8 Claims, 6 Drawing Figures

APPARATUS FOR CENTERING AND ALIGNING A WORKPIECE

BACKGROUND OF THE INVENTION

This invention relates to workpiece handling apparatus, and more particularly to apparatus for centering and aligning a workpiece having at least one planar surface.

Workpieces such as printed circuit boards ("PCBs") or ceramic substrates for integrated circuits ("ICs") must be precisely centered and aligned in the apparatus which carries out the various steps involved in fabricating the PCB or IC (e.g., printing the required circuitry on a PCB). Among the known techniques for locating and aligning such workpieces are holding two perpendicular reference edges of the workpiece against registration stops in the fabrication apparatus ("edge alignment"), or providing registration holes in the workpiece and placing the workpiece on the fabrication apparatus so that the holes fit over registration pins in that apparatus ("pin alignment").

The known centering and aligning techniques have various shortcomings. The accuracy of edge alignment decreases with the distance from the reference edges. If the workpiece is subject to distortion due to thermal expansion or the like, edge alignment may not be satisfactory for the portions of the workpiece remote from the reference edges. Pin alignment allows the alignment points to be located within the boundaries of the workpiece, thereby affording the possibility of reducing the maximum distance from the alignment points to any working portion of the workpiece. However, locating a workpiece on alignment pins is more difficult and time-consuming than edge alignment, and the difficulty increases if the workpiece is even moderately distorted.

It is therefore an object of this invention to improve workpiece centering and aligning apparatus.

It is another object of this invention to provide workpiece centering and aligning apparatus which combines the ease of use of edge alignment with the increased accuracy of pin alignment.

SUMMARY OF THE INVENTION

These and other objects of the invention are accomplished in accordance with the principles of the invention by providing workpiece centering and aligning apparatus having three laterally spaced cams that initially fit relatively loosely into three apertures in the workpiece. The cams are rotatable about axes perpendicular to the plane of the workpiece. As the cams rotate, they engage the sides of the associated workpiece holes and thereby center and align the workpiece.

Further features of the invention, its nature and various advantages will be more apparent from the accompanying drawings and the following detailed description of the invention.

DETAILED DESCRIPTION OF THE INVENTION

Figure 1:
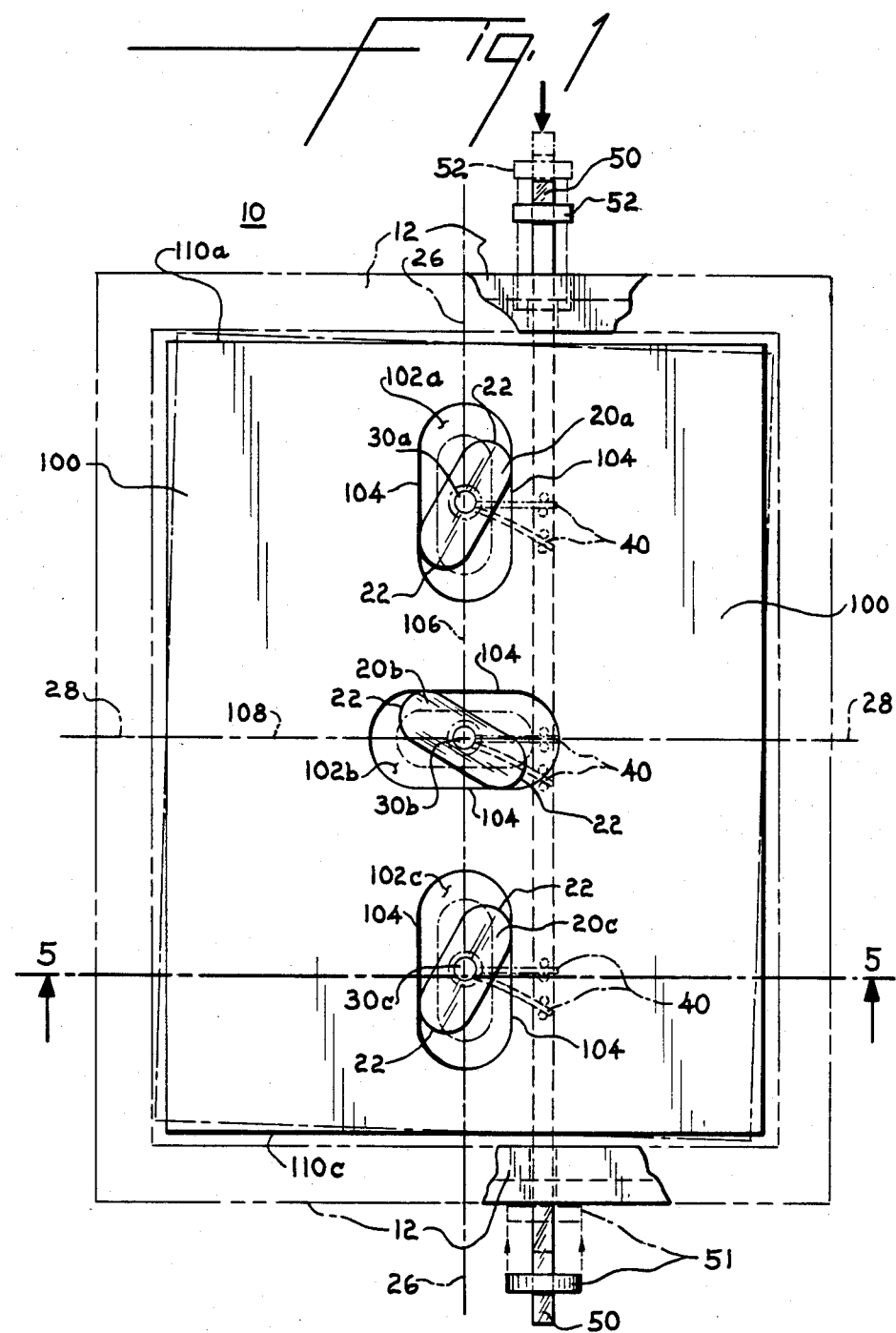
FIG. 1 is a top plan view of a first illustrative embodiment of the invention.

As shown in FIG. 1, the workpiece centering and aligning apparatus 10 of this invention includes horizontal planar work surface 12 for supporting planar workpiece 100 during fabrication steps carried out on the workpiece. Above surface 12 are three horizontal planar cam members 20a, 20b, and 20c. Cam members 20 are laterally spaced from one another along axis 26 of apparatus 10. Each of cam members 20 is elongated so that its length is greater than its width. Both ends of each cam member are rounded as indicated at 22.

Each cam member 20 is fixedly mounted on the upper end of a respective one of vertical shafts 30a, 30b, and 30c, all of which intersect axis 26. Shafts 30 extend downwardly through surface 12 and each is rotatable about its longitudinal axis. The mechanism for rotating shafts 30 is located below surface 12 and will be described in detail later. Each cam member 20 is symmetrical about and concentric with the associated shaft 30.

Figure 2:
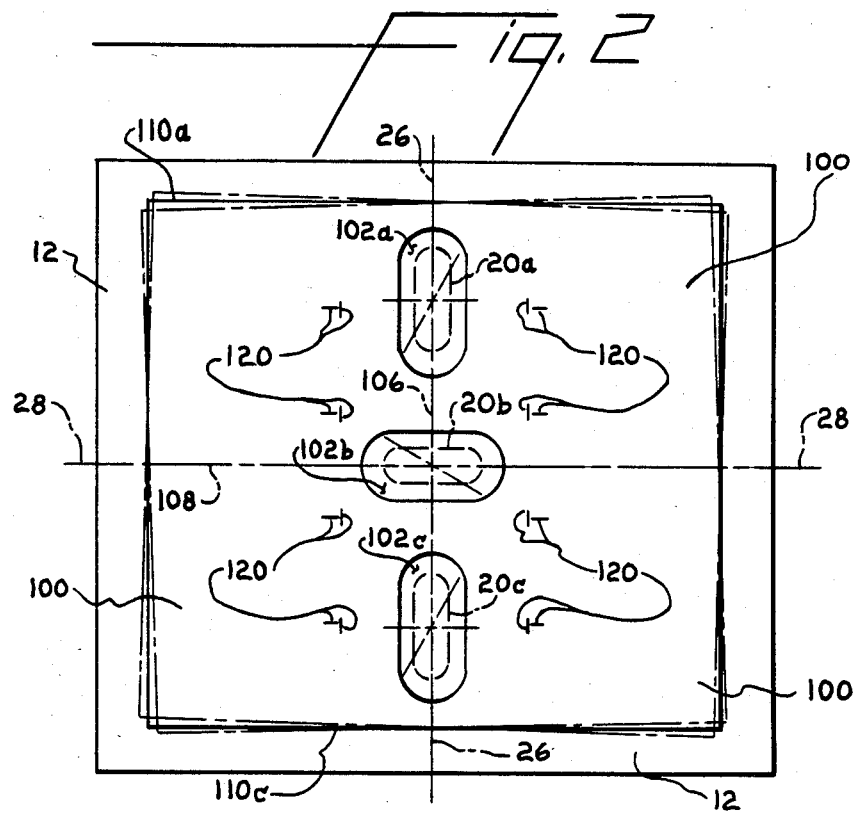
FIG. 2 is a top plan view illustrating a second embodiment of the invention.
Figure 3:
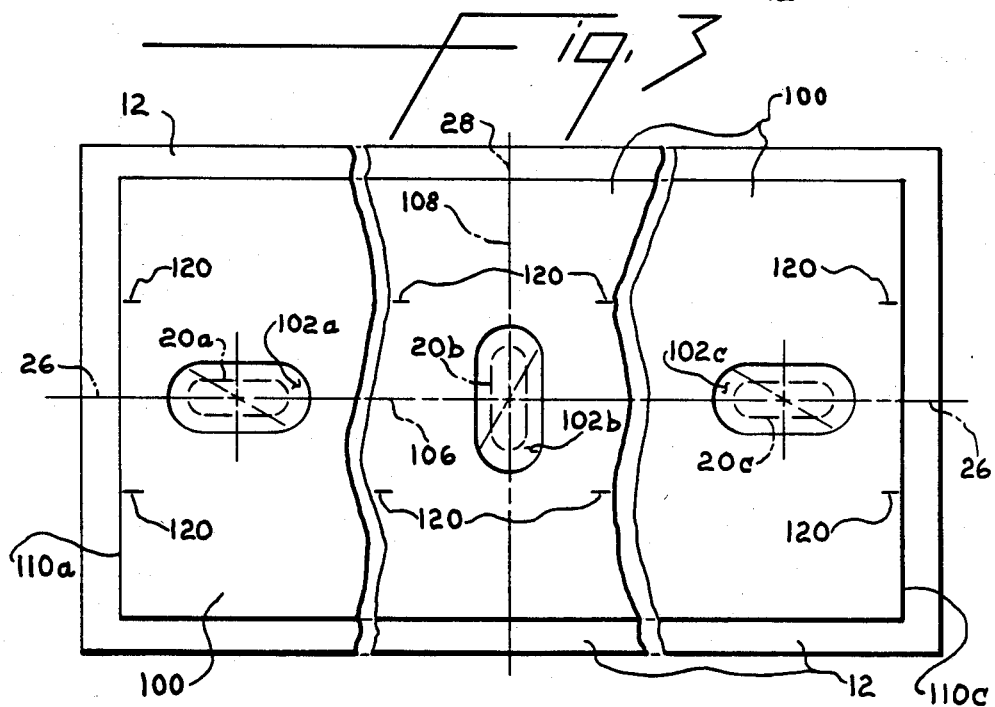
FIG. 3 is a top plan view illustrating a third embodiment of the invention.
Figure 4:
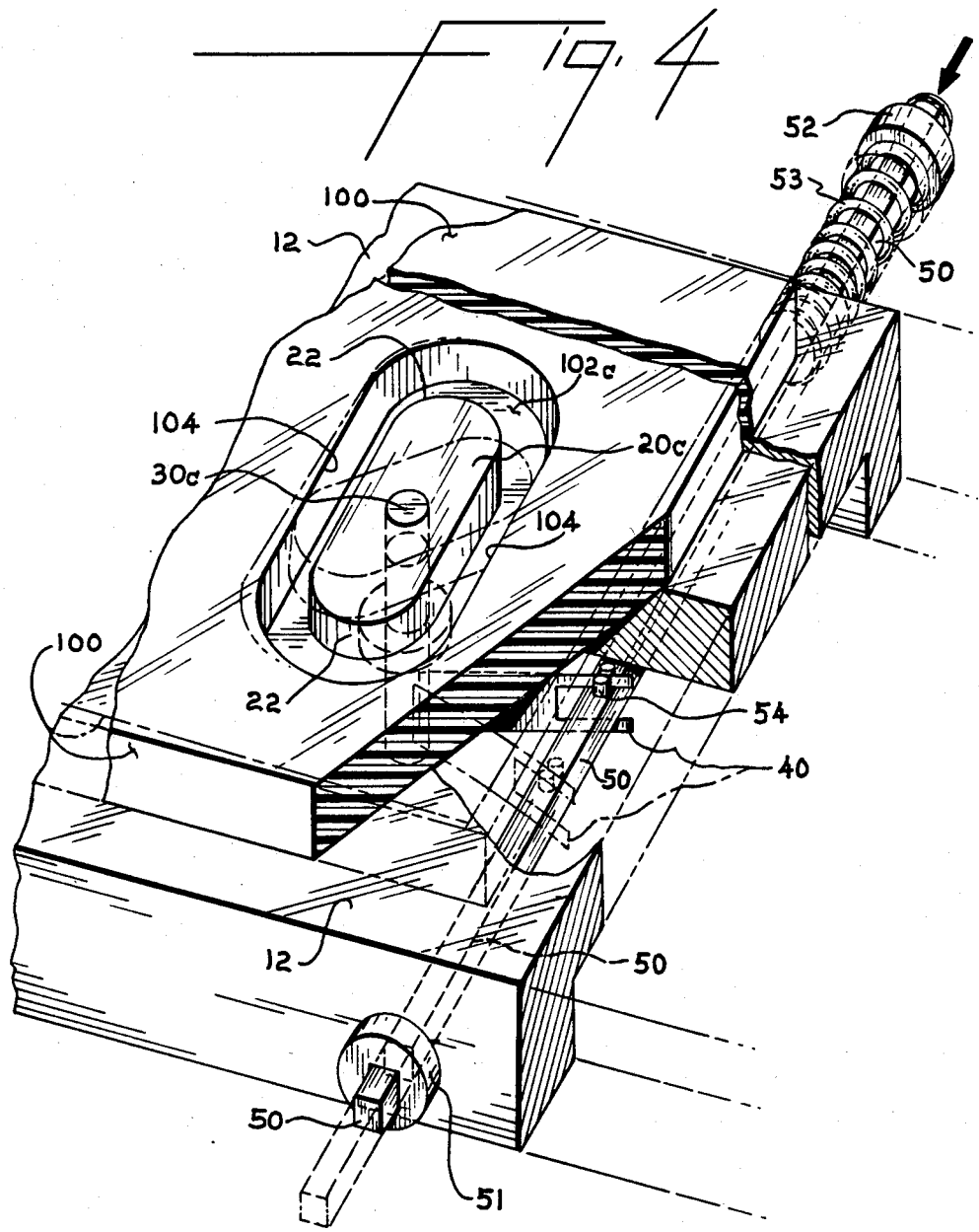
FIG. 4 is a partial, cut away, perspective view of the apparatus of the invention.

The initial positions of cam members 20 are shown in broken lines in FIGS. 1-3 and in solid lines in FIG. 4. In their initial positions, the axis of elongation of each of cam members 20a and 20c is substantially parallel to axis 26, and the axis of elongation of cam member 20b is substantially parallel to axis 28, which is perpendicular to axis 26 and which intersects axis 26 where shaft 30b intersects that axis. Cam members 20a and 20c are on opposite sides of cam member 20b and approximately equidistant from it.

As mentioned above, the mechanism for controlling the rotation of shafts 30 is located below surface 12. Each shaft 30 has a leaf spring lever arm 40 projecting laterally from it. The free end of each leaf spring 40 is engaged between pins 54 which are affixed to rod 50. Rod 50 is substantially parallel to axis 26. Rod 50 is mounted for longitudinal reciprocation relative to surface 12. If desired, the amount of motion of rod 50 may be limited by stops 51 and 52 mounted on the rod 50 for cooperation with stationary parts of the apparatus. Rod 50 may be reciprocated manually with a spring 53 or by any suitable automatic or semi-automatic means such as a cam, or a pneumatic or hydraulic cylinder.

When rod 50 is in its initial position (an upper position as viewed in FIGS. 1 and 4), it holds cam members 20 in their initial positions. When rod 50 is moved out of its initial position (in the downward direction as viewed in FIGS. 1 and 4), it causes each cam member 20 to rotate clockwise (to the solid line positions shown in FIG. 1 or the broken line position shown in FIG. 4).

Considering now the operation of apparatus 10 in relation to workpiece 100, the function of the apparatus is to align mutually perpendicular workpiece axes 106 and 108 with mutually perpendicular apparatus axes 26 and 28, respectively. In that way workpiece 100 is both centered and aligned relative to apparatus 10.

Workpiece 100 has three laterally spaced apertures 102a, 102b, and 102c, each of which passes through the workpiece along an axis perpendicular to the plane of the workpiece. Apertures 102 are spaced along axis 106 in the same manner that cam members 20 are spaced along axis 26. Aperture 102b is located at the intersection of axes 106 and 108. Apertures 102a and 102c are located on opposite sides of aperture 102b and are approximately equidistant from it.

Each of apertures 102 is elongated in the same way that cam members 20 are elongated. The axis of elongation of each aperture 102a and 102c is parallel to axis 106. The axis of elongation of aperture 102b is parallel to axis 108. The long sides 104 of each aperture 102 are straight and parallel to one another. Sides 104 of aperture 102a are parallel to axis 106 and symmetrically disposed on opposite sides of that axis. The same is true of sides 104 of aperture 102c. Sides 104 of aperture 102b are parallel to axis 108 and symmetrically disposed on opposite sides of that axis.

Each of apertures 102 is designed to loosely receive a respective one of cam members 20 when the cam members are in their initial positions. Accordingly, the length and width of each aperture 102 are respectively substantially greater than the length and width of the associated cam member 20. However, the width of each aperture 102 (i.e., the distance between the parallel sides 104 of that aperture) is substantially less than the length of the associated cam member 20.

When workpiece 100 is to be centered and aligned by the apparatus, rod 50 is first moved to its so-called initial position. This aligns cam members 20a and 20c with axis 26 and aligns cam member 20b with axis 28 as shown in broken lines in FIGS. 1-3 and in solid lines in FIG. 4. Workpiece 100 is then placed on surface 12 so that each of cam members 20a–c enters a respective one of apertures 102a–c. This is easily accomplished because cam members 20 are substantially narrower than apertures 102 as mentioned above. Rod 50 is then reciprocated to its so-called final position. This causes each of cam members 20 to rotate clockwise to the positions shown in solid lines in FIGS. 1-3 and in broken lines in FIG. 4. As each cam member 20 rotates, each rounded end 22 of the cam member contacts and pushes on a respective one of the straight sides 104 of associated aperture 102. Cams 20a and 20c therefore tend to align workpiece axis 106 with apparatus axis 26, while cam 20b tends to center aperture 102b relative to apparatus axis 28. The end result is that workpiece axes 106 and 108 are respectively aligned with apparatus axes 26 and 28. In this way workpiece 100 is both centered and aligned relative to apparatus 10. The broken line outlines of workpiece 100 in FIGS. 1 and 2 illustrate possible uncentered and unaligned starting positions of workpiece 100. The above-described operation of cam members 20 causes workpiece 100 to move from such positions to the final centered and aligned position shown in solids lines in those Figures.

Cam members 20 are preferably disposed so that apertures 102 can be located along a central, preferably symmetrically located, workpiece axis such as axis 106. Axis 108 is preferably also a symmetrically located workpiece axis. This reduces the maximum distance from the alignment axes to any other portion of the workpiece. Cam members 20 are also preferably disposed along an axis parallel to the longer of the two workpiece axes (i.e., axis 106 in the embodiments shown in FIGS. 1 and 3), and cam members 20a and 20c are preferably disposed near the opposite ends of that longer workpiece axis. This is most clearly illustrated in FIG. 3 which shows an embodiment for use with a very long workpiece (the length of the workpiece being parallel to the left-right axis in FIG. 3). This increases the precision with which the workpiece is aligned with the apparatus.

Cam members 20 must be thick enough to engage aperture sides 104 without damage to either the cam members or workpiece 100. If workpiece 100 is a relatively thin member such as a PCB or an IC substrate, cam members 20 are typically as thick as the workpiece 100 or thicker if practical. (FIGS. 2 and 3 illustrate embodiments in which workpiece 100 is a substrate for a large number of integrated circuits bounded by score lines 120 along which the completed workpiece will be broken to separate the individual ICs.) Score lines 120 should be continuous around each IC to afford a clean break. FIGS. 2 and 3 merely show a portion of score lines 120.

Figure 5:
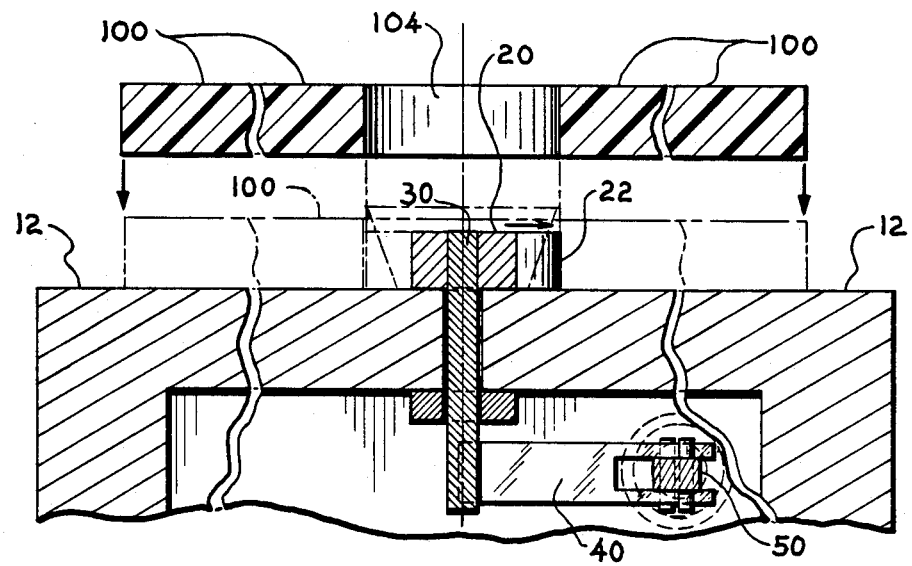
FIG. 5 is an elevational sectional view illustrating a modification of the apparatus of the invention.
Figure 6:
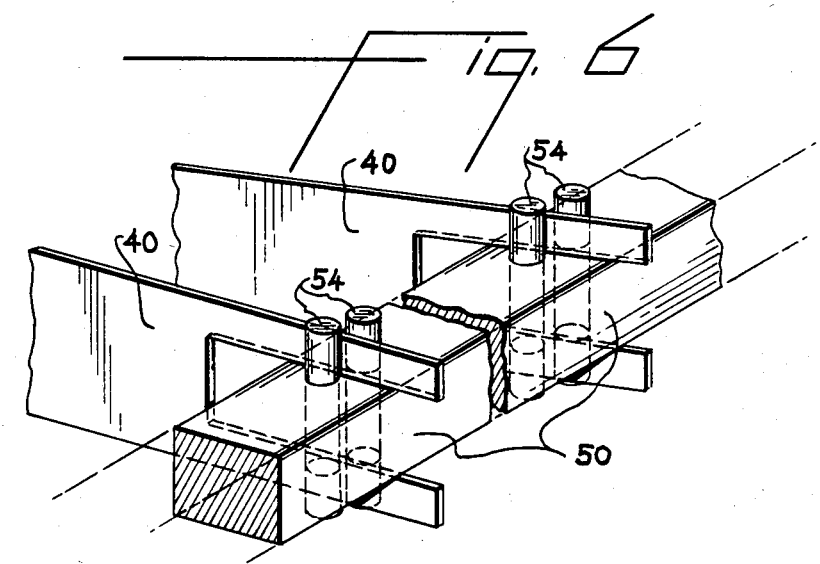
FIG. 6 is a partial cut away and enlarged view showing a portion of the apparatus.

Leaf springs 40 flex to allow rod 50 to be driven slightly beyond the point at which centering and aligning of workpiece 100 should have been completed. This assures that both ends 22 of each cam member 20 are in fact firmly in contact with the associated aperture sides 104 and that workpiece 100 is therefore fully centered and aligned. It also assures the continued application of pressure to aperture sides 104 to maintain workpiece 100 in its centered and aligned position throughout the fabrication steps to which the workpiece is subjected. This has the additional advantage of tending to hold workpiece 100 down on surface 12. (This hold-down effect can be enhanced as shown in FIG. 5 by making each cam member 20 somewhat thicker than workpiece 100 and with an outward taper from bottom to top so that the upper portion of each cam member overhangs workpiece 100 when the cam members are pivoted into engagement with the workpiece.)

It will be understood that the foregoing is merely illustrative of the principles of the invention and that various modifications can be made by those skilled in the art without departing from the scope and spirit of the invention. For example, although it is preferable that all three cam members be disposed along a common axis (26), this may not be strictly necessary in all applications of the invention. One or more of the cam members can be displaced somewhat from the common axis provided the displacement does not prevent the apparatus from properly centering and aligning the workpiece. Even if all of cam members 20 are not disposed along a common axis, two cam members must act transversely to one axis (or two parallel axes) in the manner in which cam members 20a and 20c act transversely to axis 26 in the depicted embodiments, and the third cam member must act transversely to another axis which is substantially perpendicular to the first axis (or axes) in the manner in which cam member 20 acts transversely to axis 28 in the depicted embodiments.

I claim:

1. Apparatus for centering and aligning a planar workpiece having three laterally spaced elongated apertures, the axes of elongation of a first and second of the apertures being parallel to a first workpiece axis, and the axis of elongation of the third aperture being substantially perpendicular to the first workpiece axis, the apparatus comprising:

planar surface for supporting the workpiece;

first, second, and third elongated cam members mounted adjacent the workpiece supporting surface, each cam member being adapted to be received within a respective one of the apertures and having width and length respectively less than the width and length of the associated aperture, the length of each cam member being greater than the width of the associated aperture; and means for rotating each of the cam members about an associated axis which is perpendicular to the workpiece supporting surface from an initial position in which the axis of elongation of the cam member is substantially parallel to the axis of elongation of the associated aperture to a final position in which each end of the cam member is in contact with a respective one of the sides of the associated aperture, said axes of rotation of the first, second and third cam members intersecting a common axis in the plane of the workpiece supporting surface, said first and second cam members being located on respective opposite sides of the third cam member along said intersecting common axis.

2. The apparatus defined in claim 1 wherein each of the first, second, and third cam members is symmetrical about the associated axis of rotation.

3. The apparatus defined in claim 1 wherein at least one of the cam members is thicker than the workpiece and wherein the upper portion of said cam member overlies the upper surface of the workpiece when the ends of said cam member are in contact with the sides of the associated aperture.

4. Apparatus for centering and aligning a planar workpiece having three laterally spaced elongated apertures, the axes of elongation of a first and second of the apertures being parallel to a first workpiece axis, and the axis of elongation of the third aperture being substantially perpendicular to the first workpiece axis, the apparatus comprising:

a planar surface for supporting the workpiece;

first, second, and third elongated cam members mounted adjacent the workpiece supporting surface, each cam member being adapted to be received within a respective one of the apertures and having width and length respectively less than the width and length of the associated aperture, the length of each cam member being greater than the width of the associated aperture;

first, second, and third rotatable shafts respectively coincident with the rotational axes of the first, second, and third cam members, each shaft being fixedly attached to the associated cam member adjacent one end of the shaft and extending below the workpiece supporting surface;

a rod substantially parallel to the plane of the workpiece supporting surface and mounted for longitudinal reciprocation below the workpiece supporting surface; and means connecting each of the shafts to the rod for converting the reciprocation of the rod to rotation of each of the shafts and the cam members about an associated axis which is perpendicular to the workpiece supporting surface from an initial position in which the axis of elongation of the cam member is substantially parallel to the axis of elongation of the associated aperture to a final position in which each end of the cam member is in contact with a respective one of the sides of the associated aperture.

5. The apparatus defined in claim 4 wherein the means for converting comprises first, second, and third lever arms, each connected adjacent one end to a respective one of the shafts and extending substantially perpendicular to the rotational axis of the associated shaft, all of the lever arms being connected to the rod adjacent the other end of each lever arm.

6. The apparatus defined in claim 5 wherein each lever arm is transversely flexible parallel to the plane of the workpiece supporting surface.

7. The apparatus defined in claim 6 wherein the rod is driven beyond the point at which the ends of the cam members contact the sides of the associated apertures to cause the lever arms to flex and thereby resiliently bias the ends of the cam members against the sides of the associated apertures.

8. The apparatus defined in claim 6 wherein all of the shafts intersect a common axis in the plane of the workpiece supporting surface and wherein the rod is substantially parallel to said common axis.

* * * * *